US008584064B2

(12) United States Patent  
Matsuda

(10) Patent No.: US 8,584,064 B2  
(45) Date of Patent: Nov. 12, 2013

(54) VERIFICATION SUPPORT APPARATUS AND VERIFICATION SUPPORT METHOD TO VERIFY TARGET CIRCUIT BASED ON HARDWARE DESCRIPTION INFORMATION

(75) Inventor: Akio Matsuda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 615 days.

(21) Appl. No.: 12/949,094

(22) Filed: Nov. 18, 2010

(65) Prior Publication Data

US 2011/0119655 A1 May 19, 2011

(30) Foreign Application Priority Data

Nov. 19, 2009 (JP) ................................ 2009-264234

(51) Int. Cl.
- G06F 9/455 (2006.01)
- G06F 17/50 (2006.01)
- G06F 11/22 (2006.01)
- G06F 9/44 (2006.01)

(52) U.S. Cl.
USPC ........... 716/106; 716/107; 716/110; 716/111; 716/112; 716/136; 717/124; 717/127; 717/131; 717/132; 717/135

(58) Field of Classification Search
None
See application file for complete search history.

(56) References Cited

U.S. PATENT DOCUMENTS

| | | | |
|---|---|---|---|
| 6,363,520 B1 * | 3/2002 | Boubezari et al. | 716/103 |
| 7,464,015 B2 | 12/2008 | Iwashita | |
| 8,099,697 B2 * | 1/2012 | Matsuda et al. | 716/106 |
| 2006/0190861 A1 | 8/2006 | Matsuura | |
| 2008/0288902 A1 * | 11/2008 | Nishide et al. | 716/5 |

FOREIGN PATENT DOCUMENTS

| | | |
|---|---|---|
| JP | 2006-190209 A | 7/2006 |
| JP | 2006-201980 A | 8/2006 |

OTHER PUBLICATIONS

Jing-Yang Jou, "Coverage Analysis Techinques for HLD Design Validation", In Proc. Asia Pacific CHip Design Languages, pp. 48-55, Fukuoka, Japan, Oct. 1999.*  
C. Richard Ho, "Early Formal Verification of Conditional Coverage Points to Identify Intrinsically Hard-to-Verify Logic", Design Automation Conference, 2008. DAC 2008. 45th ACM/IEEE.*  
Foster,, Harry D. et al., "Assertion-Based Design (2nd Edition), (Programming Code metrics)", 2004, pp. 129-130.

* cited by examiner

Primary Examiner — Lewis A Bullock, Jr.  
Assistant Examiner — Mark Gooray  
(74) Attorney, Agent, or Firm — Fujitsu Patent Center

(57) ABSTRACT

A non-transitory, recording medium stores therein a program that causes a computer to execute extracting from hardware description of a circuit, a conditional branch statement representing a conditional branch process; determining whether the extracted conditional branch statement includes at least three condition expressions, where a given combination thereof has exclusive satisfying conditions; extracting from the conditional branch statement determined at the determining, a combination of condition expressions for which satisfying conditions are exclusive; extracting each condition expression from the extracted combination and creating, for each extracted condition expression and according to an order of appearance in the hardware description, a conditional branch statement in which the extracted condition expression has a hierarchical relationship with a condition expression not included in the combination; generating an assertion for checking whether a specified condition is satisfied in each created conditional branch statement; and outputting, as assertion data of the circuit, the generated assertion.

9 Claims, 16 Drawing Sheets

FIG.4

| INPUT | | | OUTPUT | | | | | |
|---|---|---|---|---|---|---|---|---|
| CONDITION EXPRESSION | | | CORRECT IMPLEMEN- TATION | BUG MODEL | | | | |
| A | B | C | | 1 | 2 | 3 | 4 | 5 |
| 1 | 1 | 1 | ① | ① | ② | ③ | ② | ③ |
| 1 | 1 | 0 | ① | ① | ② | ② | ② | ① |
| 1 | 0 | 1 | ① | ① | ① | ③ | ③ | ③ |
| 1 | 0 | 0 | ① | ① | ① | ① | ① | ① |
| 0 | 1 | 1 | ② | ③ | ② | ③ | ② | ③ |
| 0 | 1 | 0 | ② | ② | ② | ② | ② | ② |
| 0 | 0 | 1 | ③ | ③ | ③ | ③ | ③ | ③ |
| 0 | 0 | 0 | ④ | ④ | ④ | ④ | ④ | ④ |

FIG.5

| CONDITION EXPRESSION | |
|---|---|
| B | C |
| 1 | 1 |
| 1 | 0 |
| 0 | 1 |
| 0 | 0 |

FIG.6

| INPUT | | | OUTPUT | | | | | |
|---|---|---|---|---|---|---|---|---|
| CONDITION EXPRESSION | | | CORRECT IMPLEMEN-TATION | BUG MODEL | | | | |
| A | B | C | | 1 | 2 | 3 | 4 | 5 |
| 1 | ✕ | ✕ | ① | ① | ① | ① | ① | ① |
| 1 | 1 | 0 | ① | ① | ② | ② | ② | ① |
| 1 | 0 | 1 | ① | ① | ① | ③ | ③ | ③ |
| 1 | 0 | 0 | ① | ① | ① | ① | ① | ① |
| 0 | ✕ | ✕ | ② | ② | ② | ② | ② | ② |
| 0 | 1 | 0 | ② | ② | ② | ② | ② | ② |
| 0 | 0 | 1 | ③ | ③ | ③ | ③ | ③ | ③ |
| 0 | 0 | 0 | ④ | ④ | ④ | ④ | ④ | ④ |

FIG.8

| INPUT | | | OUTPUT | | | | | |
|---|---|---|---|---|---|---|---|---|
| CONDITION EXPRESSION | | | CORRECT IMPLEMEN-TATION | BUG MODEL | | | | |
| A | B | C | | 1 | 2 | 3 | 4 | 5 |
| 1 | X | X | ① | ① | ① | ① | ① | ① |
| 1 | 1 | 0 | ① | ① | ② | ② | ② | ① |
| 1 | 0 | 1 | ① | ① | ① | ③ | ③ | ③ |
| 1 | 0 | 0 | ① | ① | ① | ① | ① | ① |
| 0 | X | X | ② | ② | ② | ② | ② | ② |
| 0 | 1 | 0 | ② | ② | ② | ② | ② | ② |
| 0 | 0 | 1 | ③ | ③ | ③ | ③ | ③ | ③ |
| 0 | 0 | 0 | ④ | ④ | ④ | ④ | ④ | ④ |

FIG.13

| INPUT | | | OUTPUT | | | | | |
|---|---|---|---|---|---|---|---|---|
| CONDITION EXPRESSION | | | CORRECT IMPLEMEN-TATION | BUG MODEL | | | | |
| A | B | C | | 1 | 2 | 3 | 4 | 5 |
| ~~1~~ | ~~X~~ | ~~X~~ | ~~①~~ | ~~①~~ | ~~①~~ | ~~①~~ | ~~①~~ | ~~①~~ |
| 1 | 1 | 0 | ① | ① | ② | ② | ② | ① |
| 1 | 0 | 1 | ① | ① | ① | ③ | ③ | ③ |
| 1 | 0 | 0 | ① | ① | ① | ① | ① | ① |
| ~~0~~ | ~~X~~ | ~~X~~ | ~~①~~ | ~~①~~ | ~~①~~ | ~~①~~ | ~~①~~ | ~~①~~ |
| 0 | 1 | 0 | ② | ② | ② | ② | ② | ② |
| 0 | 0 | 1 | ③ | ③ | ③ | ③ | ③ | ③ |
| 0 | 0 | 0 | ④ | ④ | ④ | ④ | ④ | ④ |

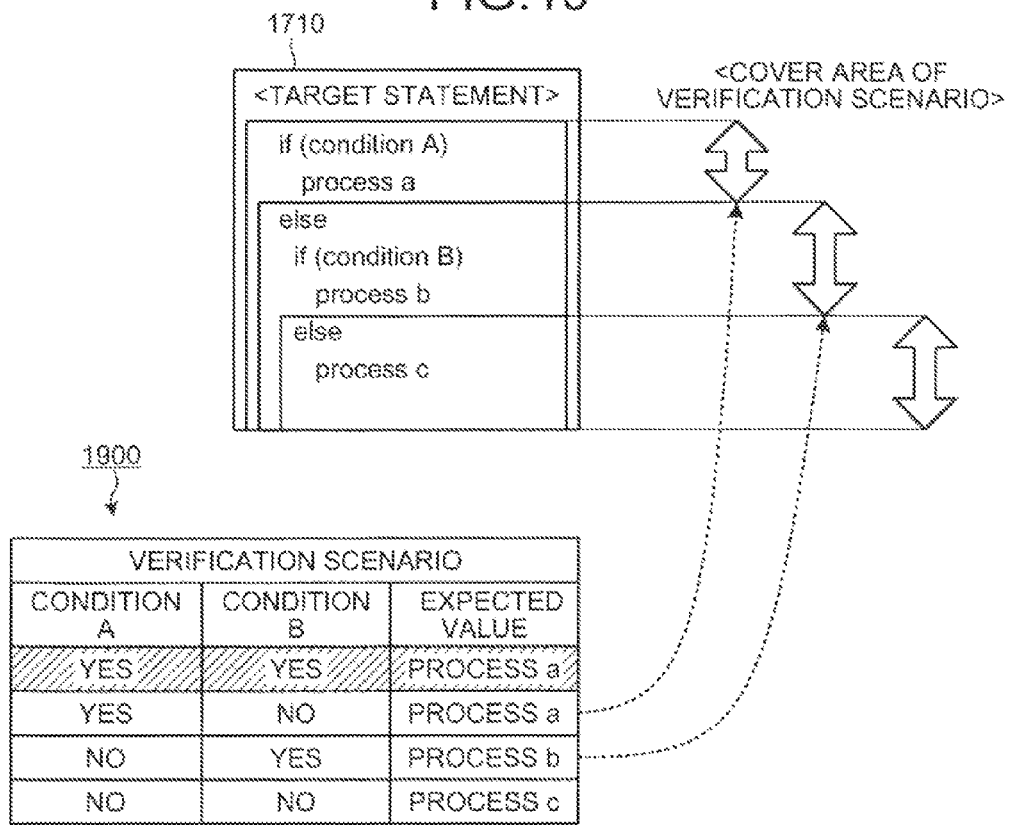

VERIFICATION SUPPORT APPARATUS AND VERIFICATION SUPPORT METHOD TO VERIFY TARGET CIRCUIT BASED ON HARDWARE DESCRIPTION INFORMATION

CROSS REFERENCE TO RELATED APPLICATIONS

This application is based upon and claims the benefit of priority of the prior Japanese Patent Application No. 2009-264234, filed on Nov. 19, 2009, the entire contents of which are incorporated herein by reference.

FIELD

The embodiment discussed herein is related is related to supporting verification of a circuit for which hardware has been designed.

BACKGROUND

Conventionally, for hardware (circuits) designed to realize a given function, logical verification is requisite as a pre-process of actual hardware manufacture to detect omissions in the design. Specifically, logical verification is performed using output that results from an input of verification scenarios generated according to the design of the hardware (see, for example, Japanese Laid-Open Patent Publication Nos. 2006-190209, 2006-201980; and Foster, Harry D., et al, "Programming Code Metrics", Assertion-Based Design (2nd Edition), 2004, pp. 129-130).

Verification coverage is calculated to objectively evaluate the verification performed by the verification scenario generated as described above. Verification coverage provides an index of whether patterns for simulation verification of a target are sufficient. Verification coverage is, for example, a coverage rate that is the ratio of the number of executed patterns for simulation verification to the population constituted by all patterns of simulation verification to be verified. In this case, it is expected that the higher the verification coverage (coverage rate) is, the higher the verification accuracy becomes.

However, a problem here is how to extract "all patterns of simulation verification to be verified" that constitute the population. All patterns of simulation verification corresponding to the population are referred to as coverage reference. If patterns that are actually useless in the verification are extracted as the coverage reference, a higher coverage rate of simulation verification does not necessarily improve the actual efficiency of verification.

Thus, a method of extracting all patterns according to specific criteria, such as path coverage and code coverage, is currently used. Path coverage is patterns for verifying all paths in which state transition occurs in registers included in a target circuit. Thus, the sum of these patterns becomes the coverage reference in path coverage. Code coverage is also referred to as line coverage, and is patterns for verifying paths concerning input/output of registers described in a source code corresponding to the target circuit. Similarly, the sum of these patterns becomes the coverage reference in code coverage.

However, a bug due to an omission in verification can occur during actual operation of the circuit even if verification has been performed using verification scenarios that cover the coverage reference described above. This is because even a verification scenario having a coverage reference of 100% may miss verifying a branch condition within the circuit.

FIG. 17 depicts an example in which an error in a conditional branch is missed. For example, in designing hardware (circuit) according to a specification that specifies "condition A>condition B" as a priority of implementation, a correct statement 1710 according to the specification may be changed to an erroneous statement 1720 as depicted in FIG. 17 consequent to, for example, an erroneous correction by a designer. In the correct statement 1710, an if statement 1712 for condition B is further described within an if statement 1711 for condition A.

On the other hand, in the erroneous statement 1720, an if statement 1722 for condition A is described within an if statement 1721 for condition B. Thus, the erroneous statement 1720 represents "condition B>condition A," which contradicts the implementation intended and specified by the specification.

However, with the coverage reference described above, it is possible that a description error such as the erroneous statement 1720 is missed in at verification. FIG. 18 depicts a chart comparing the correct statement and the erroneous statement. With reference to FIG. 18, examples are described in which the correct statement 1710 and the erroneous statement 1720 are executed, respectively.

As depicted in a chart 1800 of FIG. 18, comparison of the correct statement 1710 and the erroneous statement 1720 indicates that four patterns 1801 are executed according to the evaluation result (Yes/No) of each condition. Among the four patterns 1801, for three patterns 1802 in which condition A and condition B are not satisfied (Yes) at the same time, what is executed is the same for both the correct statement 1710 and the erroneous statement 1720. On the other hand, what is executed becomes different only for a pattern 1803 in which condition A and condition B are satisfied at the same time.

FIG. 19 depicts an exemplary verification scenario with a line coverage of 100%. If the subject of verification is the correct statement 1710, for the pattern (No, No) of a verification scenario 1900 in which neither condition A nor condition B is satisfied, a process c described at the deepest position (in the bottom layer) of the correct statement 1710 is verified.

For the pattern (No, Yes) in which only condition B is satisfied, a process b in the correct statement 1710 is verified. For the pattern (Yes, No) in which only condition A is satisfied, a process a described at the shallowest position of the correct statement 1710 is verified.

Consequently, all statements of the correct statement 1710 are included in the coverage area of the verification scenario as depicted in FIG. 19. Thus, in line coverage, the coverage (coverage rate) becomes 100% without verifying the pattern (Yes, Yes) in which condition A and condition B are both satisfied.

When the path coverage described above is taken as the coverage reference, a path of the pattern (Yes, Yes) in which condition A and condition B are both satisfied does not exist in the correct statement 1710, and naturally is excluded from the population of the coverage reference. Thus, similar to the line coverage, the coverage (coverage rate) becomes 100% without verifying the pattern (Yes, Yes) in which condition A and condition B are both satisfied.

As described above, with the conventional coverage reference, it is possible for the coverage concerning conditional branches within the target circuit to not be entirely covered, even if a verification scenario having the coverage rate of 100% is generated. Nonetheless, there has been provided no technology for checking whether the coverage concerning conditional branches is covered by the generated verification scenario. Consequently, verification cannot extract an inclusion of the erroneous statement 1720 described in FIG. 17 as a problem, resulting in a hardware design that includes a bug.

Further, various specifications are generally set for processes included in hardware description. When a conditional branch statement includes several condition expressions, for example, a priority in the order of execution and/or exclusivity of the condition expressions are set. A priority may be set such as "condition expression A>condition expression B>condition expression C", where the order of execution has to give priority to a higher condition expression.

To be exclusive means that target conditions are not satisfied at the same time. For example, if condition expression A and condition expression B are listed as target conditions and are set to be exclusive, a corresponding process has to be such that condition expression A and condition expression B are not satisfied at the same time. Specifically, a process in which condition expression A=1 and condition expression B=1 is excluded.

Verification without omission becomes more difficult when the specifications such as those described above are set. If no exclusivity is set, by creating a verification scenario that causes the condition expressions to be executed in order of priority, verification without omission is possible even for a conditional branch statement that includes, for example, three or more condition expressions. However, if exclusivity is set for the condition expressions, a verification scenario is omitted for a case in which the condition expressions are not satisfied at the same time, resulting in an omission in verification.

SUMMARY

According to an aspect of an embodiment, a non-transitory, computer-readable recording medium stores therein a verification support program that causes a computer to execute extracting from hardware description of a target circuit, a conditional branch statement that represents a conditional branch process; determining whether the conditional branch statement extracted at the extracting includes at least three condition expressions, where a given combination thereof has satisfying conditions that are set to be exclusive; extracting from the conditional branch statement determined at the determining, a combination of condition expressions for which satisfying conditions are set to be exclusive; extracting each condition expression from the combination of condition expressions extracted at the extracting and creating, for each extracted condition expression and according to an order of appearance in the hardware description, a conditional branch statement in which the extracted condition expression has a hierarchical relationship with a condition expression not included in the combination; generating an assertion for checking whether a specified condition is satisfied in each conditional branch statement created at the creating; and outputting, as assertion data of the target circuit, the assertion generated at the generating.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 depicts a relationship between the bug models and assertions.

FIG. 5 depicts exclusivity of condition expressions.

FIG. 6 depicts a relationship between the bug models and the assertions when exclusive condition expressions are included.

FIG. 8 depicts an example of verification when exclusive condition expressions are included.

FIG. 13 depicts a relationship between the bug models and the assertions when exclusivity is taken into account.

FIG. 18 depicts a chart comparing a correct statement and an erroneous statement.

FIG. 19 depicts an exemplary verification scenario with a line coverage of 100%.

DESCRIPTION OF EMBODIMENTS

Preferred embodiments of the present invention will be explained with reference to the accompanying drawings.

Figure 1:
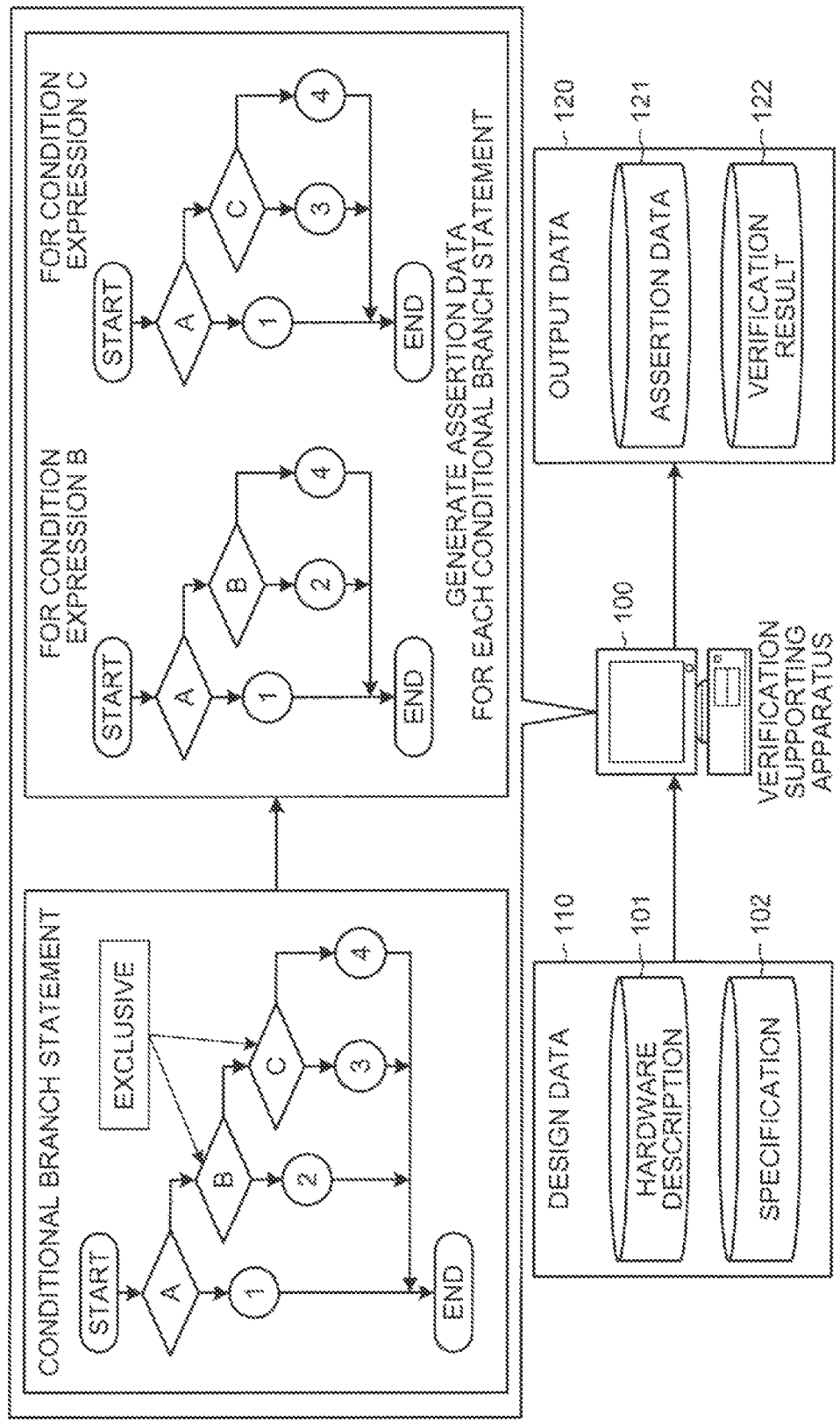
FIG. 1 depicts an exemplary verification support process according to an embodiment.

FIG. 1 depicts an exemplary verification support process according to an embodiment. As depicted in FIG. 1, a verification support apparatus 100 according to the embodiment uses hardware description 101 and a specification 102 input as design data 110 for a target circuit subject to verification to generate output data 120 concerning verification of the target circuit. As depicted in FIG. 1, assertion data 121 and a verification result 122 are output as the output data 120. Actually, the verification result 122 can be output only when the verification support apparatus 100 includes a functional unit that executes a simulation verification using the assertion data 121.

In the verification support process according to the embodiment, a conditional branch statement that includes condition expressions is extracted from the hardware description 101, and assertion data is generated for executing verification, without omission, for each condition. Thus, processes represented by the conditional branch statement and conditions that cause an omission in verification are described first.

Figure 2:
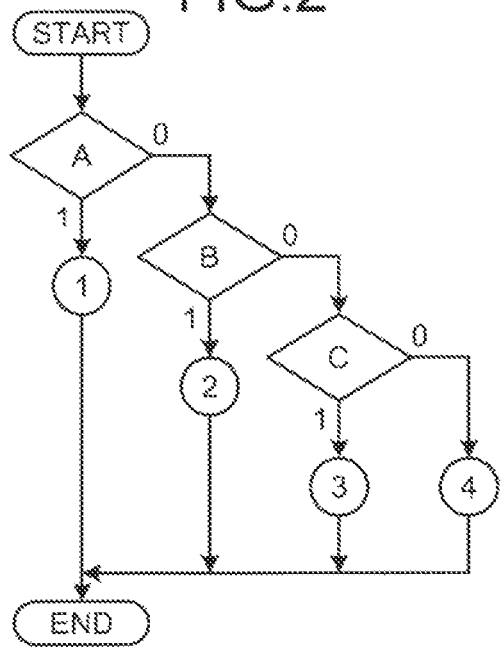
FIG. 2 depicts an exemplary conditional branch statement that includes three or more condition expressions.

FIG. 2 depicts an exemplary conditional branch statement that includes three or more condition expressions A, B, and C in a process from "START" to "END" in the hardware description 101. Various conditions are set by the specification 102 for the conditional branch statement included in the hardware description 101 of the target circuit. Specifically, a priority in the order of execution such as "condition expression A>condition expression B>condition expression C" is set for the conditional branch statement depicted in FIG. 2.

Thus, if no exclusivity is set for the conditional branch statement, all bug models that can occur in the conditional branch statement can be verified by simply generating the following two assertion data:
1. cover (condition expression A and condition expression B)
2. cover (!condition expression A and (condition expression B and condition expression C))

Figure 3:
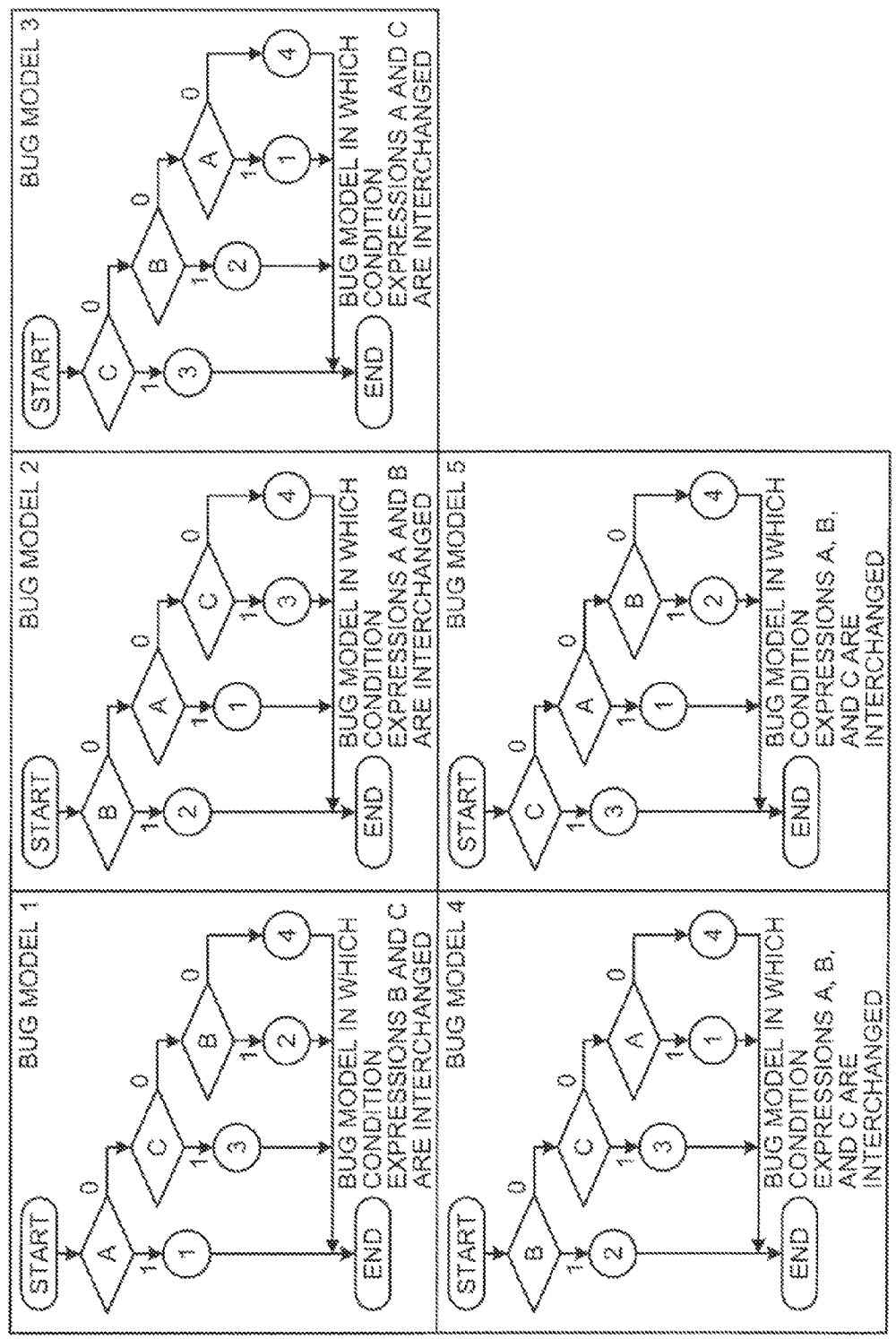
FIG. 3 depicts exemplary bug models.

FIG. 3 depicts exemplary bug models. Bug models 1 to 5 depicted in FIG. 3 are conditional branch processes that can occur in the conditional branch statement of FIG. 2. As described in the description of conventional arts, bug models 1 to 5 occur due to a description error on the part of a designer. Thus, verification without assuming bug models 1 to 5 can result in an implementation of a circuit in which the order of execution of the condition expressions in the conditional branch statement are interchanged as depicted in FIG. 3.

Despite the description error on the part of the designer described above, it is relatively easy to achieve verification without omission if no exclusivity is set for the condition expressions. Specifically, if bug models 1 to 5 are assumed, all bug models can be detected without omission, by executing simulation verification corresponding to the assertion data 1 and 2.

FIG. 4 depicts a relationship between the bug models and the assertions. A chart 400 represents a relationship between the input and the output of each bug model. In the chart 400, each of the values (1/0) of A, B, and C on the input side represents the evaluation result of the condition expression. On the other hand, each of the values of 1 to 5 on the output side represents an output value when the conditional branch statement is executed. Thus, if the conditional branch statement is correctly implemented, any value among 1 to 4 is output as the output value.

As depicted by the values of 1 to 5 on the output side of the chart 400, for rows 410, the output values are the same as those for the correct implementation, irrespective of which bug model is used to execute the process. Thus, the occurrence of a bug in the conditional branch statement cannot be detected unless simulation verification yields an output value different from the correct implementation when the process is executed by a bug model.

Simulation verification corresponding to the assertion data 1 and 2 corresponds to the process at rows 411 and 412 hatched in the chart 400. Output values different from the correct implementation are obtained by bug models 2 to 4 in the process at row 411, and by bug models 1, 3, and 5 in the process at row 412. Thus, for all patterns, the presence of a bug can be determined by executing simulation verification according to the assertion data 1 and 2.

FIG. 5 depicts exclusivity of condition expressions. As depicted in a chart 500, condition expressions can be set to be exclusive in the specification 102. To be exclusive is a restriction that a state of "B=1 and C=1" (represented by the row 510 of the chart 500) where the condition expressions B and C are satisfied at the same time never occurs. Thus, the condition expressions B and C are always executed in the states represented by the rows 520.

The embodiment aims to achieve verification, without omission, not only for a conditional branch statement that includes three or more condition expressions as described in FIGS. 2 to 4, but also for a conditional branch statement for which a combination of exclusive condition expressions is set as depicted in FIG. 5. However, a mere application of the above assertion data 1 and 2 can cause an omission in verification if exclusivity has been set.

FIG. 6 depicts a relationship between the bug models and the assertions when exclusive condition expressions are included. A chart 600 represents a relationship between the input and the output of each bug model when the condition expressions B and C are set to be exclusive as described in FIG. 5 in the conditional branch statement constituted by the condition expressions A, B, and C depicted in FIG. 2.

Since the exclusivity is set, the processes at rows 610 and 620 in which condition expressions B and C are satisfied at the same time are not executed. The output values at row 620 are obtained by execution of simulation verification corresponding to the assertion data 2. However, it becomes impossible to obtain the output values since the exclusivity is set. Consequently, only an occurrence of the bug models 2 to 4 can be detected, and an omission in verification may be caused when other bug model occurs.

Figure 7:
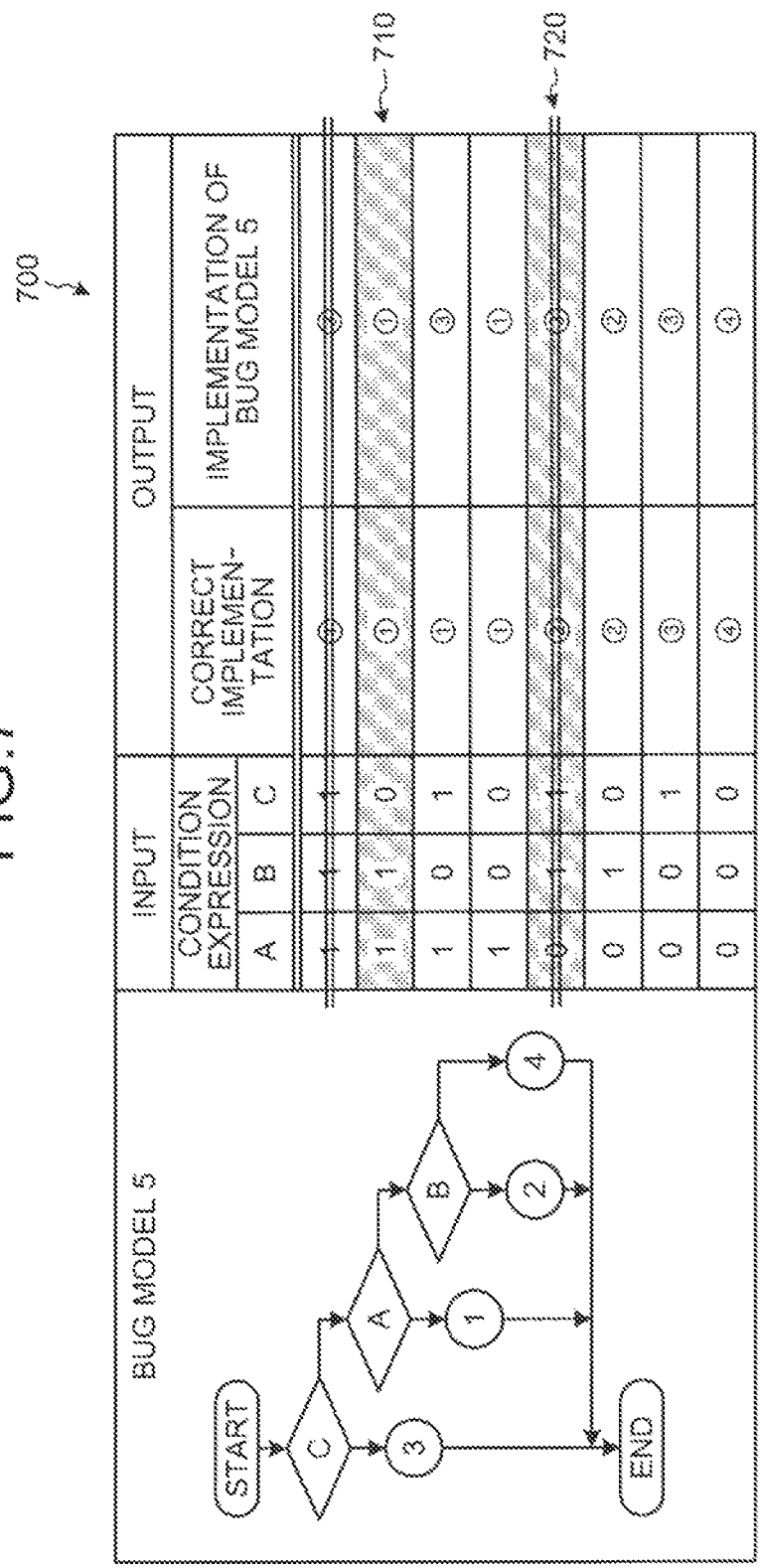
FIG. 7 depicts an example in which a bug model cannot be detected due to exclusivity.

FIG. 7 depicts an example in which a bug model cannot be detected due to exclusivity. As depicted in a chart 700, if the bug model 5 is erroneously implemented, output values different from the correct implementation are obtained (a bug is detected) only in the case of input values (A, B, C)=(1, 1, 1), (1, 0, 1), or (0, 1, 1).

If no exclusivity is set, the occurrence of a bug that makes the output value differ from the correct implementation is detected using output values at rows 710 and 720 obtained by the assertion data 1 and 2, respectively. In this case, the occurrence of the bug cannot be detected by the output value at row 710 alone since there is no difference between the output value of the bug model 5 and that of the correct implementation. In other words, the occurrence of any bug models can be detected only when the above assertion data 1 and 2 are both used.

FIG. 8 depicts an example of verification when exclusive condition expressions are included. As described above, output values at rows 610 and 620 of the chart 600 cannot be obtained when the exclusivity is set. To detect the occurrence of the bug model 5, for example, simulation verification has to be performed for a process other than those at rows 610 and 620 in which the output values are different between the correct implementation and the bug model 5. In the example of FIG. 8, a row 800 corresponds to the process in which the output values are different between the correct implementation and the bug model 5. However, no assertion data for executing simulation verification corresponding to the row 800 has been provided.

Verification without omission is particularly difficult for a conditional branch statement that includes, as depicted in FIG. 1, three or more condition expressions, where a given combination thereof has satisfying conditions that are set to be exclusive. For such a conditional branch statement, the embodiment releases the hierarchical relationship of the condition expressions set to be exclusive, and creates independent conditional branch statements for the condition expressions, respectively. Since the condition expressions B and C are set to be exclusive in FIG. 1, independent conditional branch statements are created for the condition expressions B and C, respectively, and assertion data is generated for each conditional branch statement in a similar manner to the assertion data 1 and 2.

As described above, in the embodiment, when a conditional branch statement including three or more condition expressions set to be exclusive (for which verification without omission has been conventionally difficult) is extracted, the exclusive condition expressions are separated and conditional branch statements are newly created. Verification without omission can be achieved by generating assertion data for each conditional branch statement and executing simulation verification.

A configuration and operation of the verification support apparatus 100 that performs a verification support process according to the embodiment are described.

Figure 9:
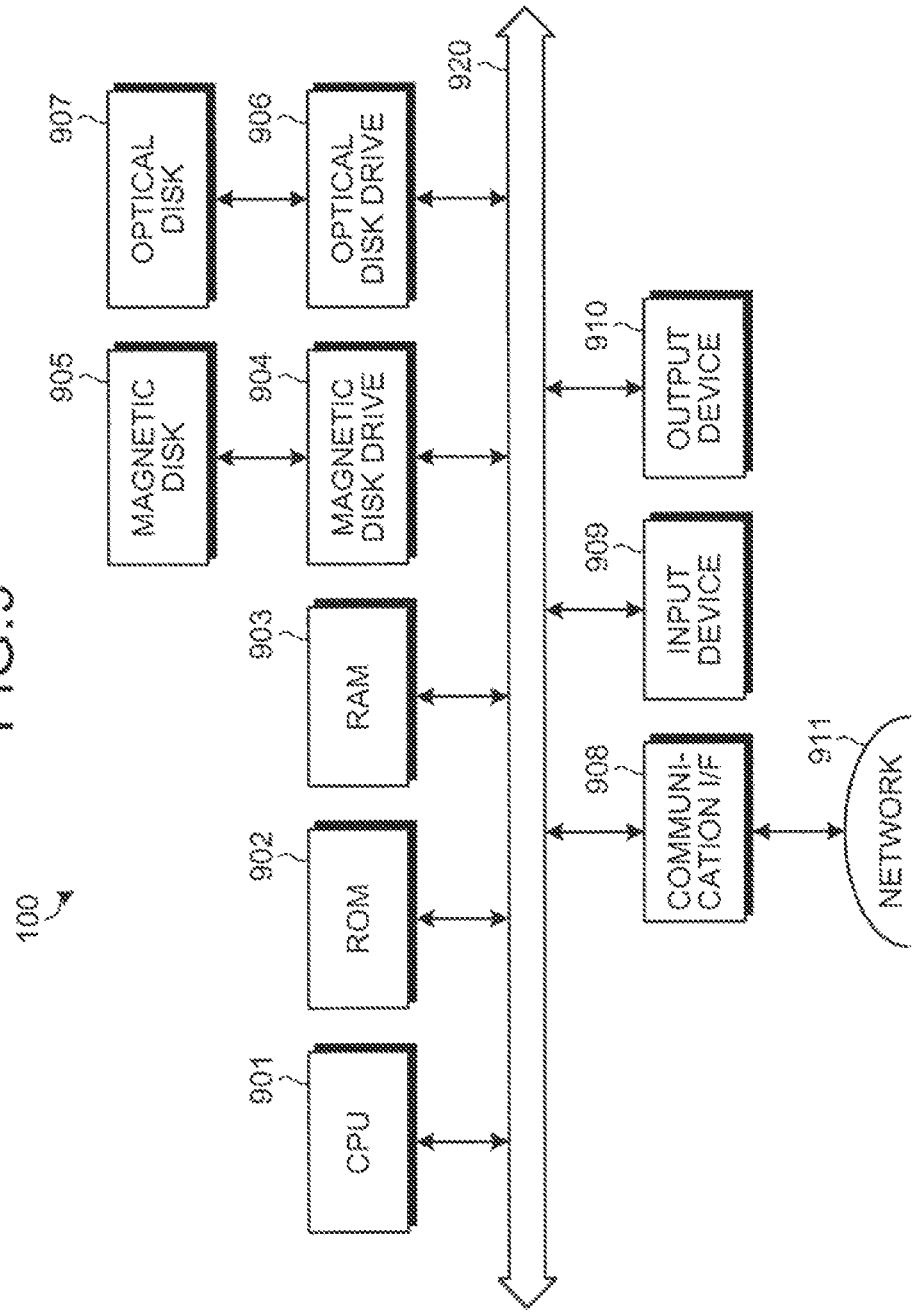
FIG. 9 is a block diagram of a hardware configuration of a verification support apparatus according to the embodiments.

FIG. 9 is a block diagram of a hardware configuration of a verification support apparatus 100 according to the embodiments. As depicted in FIG. 9, the verification support apparatus 100 includes a central processing unit (CPU) 901, a read-only memory (ROM) 902, a random access memory (RAM) 903, a magnetic disk drive 904, a magnetic disk 905, an optical disk drive 906, an optical disk 907, an interface (I/F) 908, an input device 909, and an output device 910, respectively connected by a bus 920.

The CPU 901 governs overall control of the verification support apparatus 100. The ROM 902 stores therein programs such as a boot program, a verification support program, etc. The RAM 903 is used as a work area of the CPU 901. The magnetic disk drive 904, under the control of the CPU 901, controls the reading and writing of data with respect to the magnetic disk 905.

The magnetic disk 905 stores therein data written under control of the magnetic disk drive 904. The ROM 902 may store the assertion data generated by the verification support program, a verification program that executes the simulation verification using the assertion data and verification scenarios, etc. In such a case, beyond the generated assertion data, the verification support apparatus 100 can provide actual verification results to the user.

The optical disk drive 906, under the control of the CPU 901, controls the reading and writing of data with respect to the optical disk 907. The optical disk 907 stores therein data written under control of the optical disk drive 906, the data being read by a computer.

The I/F 908 is connected to a network 911 such as a local area network (LAN), a wide area network (WAN), and the Internet through a communication line and is connected to other apparatuses through the network 911. The I/F 908 administers an internal interface with the network 911 and controls the input/output of data from/to external apparatuses. For example, a modem or a LAN adaptor may be employed as the I/F 908.

The input device 909 receives, from an external source, input to the verification support apparatus 100. The input device 909 may be, for example, a keyboard, a mouse, etc.

In the case of a keyboard, the keyboard includes, for example, keys for inputting letters, numerals, and various instructions and performs the input of data. Alternatively, a touch-panel-type input pad or numeric keypad, etc. may be adopted. In the case of a mouse, the mouse is used to move the cursor, select a region, or move and change the size of windows. A track ball or a joy stick may be adopted provided each respectively has a function similar to a pointing device.

The output device 910 outputs verification scenarios generated by the verification support apparatus 100, verification results obtained using the verification scenarios, etc. The output device 910 may be, for example, a display, a printer etc.

In the case of a display, the display displays, for example, data such as text, images, functional information, etc., in addition to a cursor, icons, or tool boxes. A cathode ray tube (CRT), a thin-film-transistor (TFT) liquid crystal display, a plasma display, etc., may be employed as the display. In the case of a printer, the output device 910, for example, prints image data and text data. A laser printer or an ink jet printer may be employed as the printer.

Figure 10:
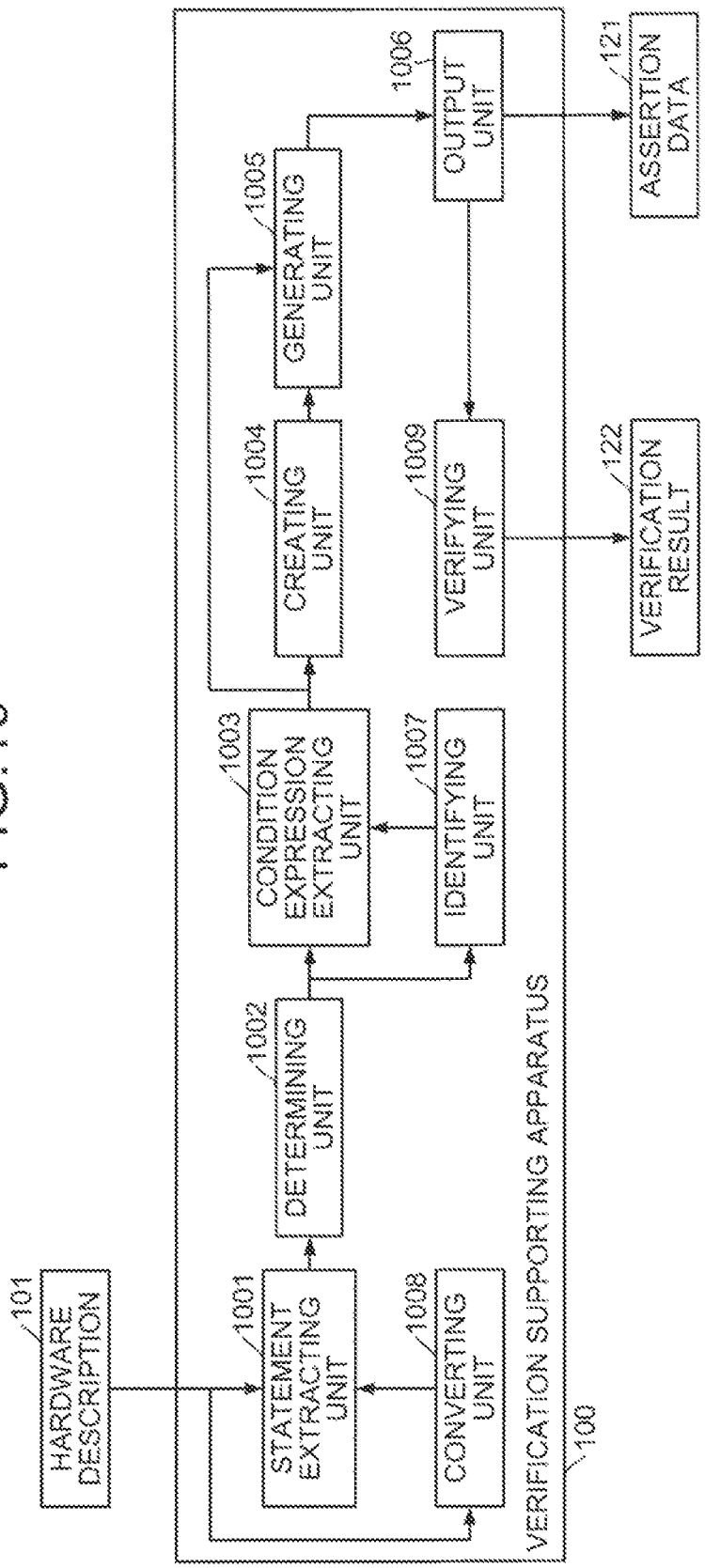
FIG. 10 is a functional block diagram of the verification support apparatus.

FIG. 10 is a functional block diagram of the verification support apparatus. The verification support apparatus 100 includes a statement extracting unit 1001, a determining unit 1002, a condition expression extracting unit 1003, a creating unit 1004, a generating unit 1005, an output unit 1006, an identifying unit 1007, a converting unit 1008, and a verifying unit 1009. These functions (the statement extracting unit 1001 to the verifying unit 1009) as a controller are implemented by, for example, the communication I/F 908 or the CPU 901 executing a verification support program stored in a storage device such as the ROM 902, the RAM 903, the magnetic disk 905, and the optical disk 907 depicted in FIG. 9.

The statement extracting unit 1001 extracts from the hardware description 101 of the target circuit, a conditional branch statement that represents a conditional branch process. The hardware descriptions 101 are described in a given language, respectively and for each language, a given word is used as the conditional branch statement. Thus, the statement extracting unit 1001 can identify a word that represents the conditional branch statement according to the language of the input hardware description 101 and thus, extract the conditional branch statement automatically. The extracted conditional branch statement is stored to a storage area such as the RAM 903, the magnetic disk 905, and the optical disk 907.

The determining unit 1002 determines whether the conditional branch statement extracted by the statement extracting unit 1001 includes condition expressions that satisfy a given condition, specifically, both of the following two conditions: 1. three or more condition expressions are included; and 2. satisfying conditions for a combination of condition expressions are set to be exclusive. The result of determination is stored to a storage area such as the RAM 903, the magnetic disk 905, and the optical disk 907.

From the conditional branch statement that has been determined by the determining unit 1002 to satisfy the given condition, the condition expression extracting unit 1003 extracts a combination for which satisfying condition expressions are set to be exclusive. Specifically, the condition expression extracting unit 1003 receives a conditional branch statement determined by the determining unit 1002 to include three or more condition expressions, where a given combination thereof has satisfying conditions that are set to be exclusive.

Thus, the condition expression extracting unit 1003 extracts from the input conditional branch statement, a combination of condition expressions set to be exclusive. The extracted combination of condition expressions is stored to a storage area such as the RAM 903, the magnetic disk 905, and the optical disk 907.

The creating unit 1004 creates conditional branch statements using specified condition expressions. Specifically, the creating unit 1004 creates, for each condition expression extracted by the condition expression extracting unit 1003, a conditional branch statement in which the condition expression has a hierarchical relationship with a condition expression other than the condition expressions set to be exclusive. The creating unit 1004 can determine a hierarchical relationship among condition expressions according to the order of appearance in the hardware description 101.

For example, when the condition expressions B and C are extracted from the conditional branch statement that includes the condition expressions A, B, and C depicted in FIG. 2, the creating unit 1004 identifies the hierarchical relationship between the condition expression A and the condition expression B, C and newly creates, for condition expression B, a conditional branch statement that includes condition expressions A and B. Similarly, for condition expression C, the creating unit 1004 creates a conditional branch statement that includes condition expressions A and C. The created conditional branch statements are stored to a storage area such as the RAM 903, the magnetic disk 905, and the optical disk 907.

The generating unit 1005 generates created by the creating unit 1004, an assertion for verifying whether a specified condition is satisfied in each conditional branch statement. The specified condition is, for example, a priority and the generating unit 1005 generates an assertion for verifying whether, in each conditional branch statement created by the creating unit 104, the condition expressions are included according to the specified priority.

Specifically, the generating unit 1005 generates, as the assertion, a cover statement for verifying that the condition expressions extracted by the condition expression extracting unit 1003 have been satisfied at the same time. Generated assertions are stored to a storage area such as the RAM 903, the magnetic disk 905, and the optical disk 907.

The output unit 1006 outputs the assertions generated by the generating unit 1005 as the assertion data 121 of the target circuit. Specifically, the form of output includes, for example, display on a display, printout at a printer, and/or transmission to an external device via the communication I/F 908. The assertions may be stored to a storage area such as the RAM 903, the magnetic disk 905, and the optical disk 907.

The functional units described above enable a generation of the assertion data 121 for a conditional branch statement that is in the hardware description 101 and includes three or more condition expressions, where a given combination thereof has satisfying conditions that are set to be exclusive. On the other hand, for a conditional branch statement determined by the determining unit 102 to not be such a conditional branch statement, the assertion data 121 is generated using the identifying unit 1007, according to a different procedure.

The identifying unit 1007 identifies, from conditional branch statement, statements having a given relationship. The identifying unit 1007 receives a conditional branch statement that is determined by the determining unit 1002 not to include three or more condition expressions, where a given combination thereof has satisfying conditions that are set to be exclusive. Thus, the identifying unit 1007 identifies condition expressions having a hierarchical relationship from the input conditional branch statement by referring to the order of appearance in the hardware description 101. The identified conditional branch statement is stored to a storage area such as the RAM 903, the magnetic disk 905, and the optical disk 907.

The conditional branch statement identified by the identifying unit 1007 is input to the condition expression extracting unit 1003. The condition expression extracting unit 1003 extracts, from the input conditional branch statement, a combination of condition expressions for which a specified condition can be satisfied. The extracted combination of condition expressions is input to the creating unit 1004 and used to generate the assertion data 121 in a similar manner when the exclusivity is set. Specifically, the generating unit 1005 generates an assertion for verifying whether the specified condition is satisfied in the conditional branch statement that includes the extracted combination of condition expressions.

The converting unit 1008 converts the hardware description 101 into a control flow graph (CFG) that represents a control flow in the target circuit. When the hardware description 101 is converted to the CFG, the statement extracting unit 1001 extracts from the CFG, a conditional branch statement that represents a conditional branch process. Various dedicated tools can be used for the conversion to CFG (thus, details are omitted here). The CFG after the conversion is stored to a storage area such as the RAM 903, the magnetic disk 905, and the optical disk 907.

The verifying unit 1009 executes verification using the assertion data 121 output from the output unit 1006. Specifically, the verifying unit 1009 verifies the target circuit, based on whether the output values of the verification scenarios associated with each combination of condition expressions generated by the generating unit 1005 are equivalent to expected values. A result of execution of the verification scenario and a comparison between the output value and the expected value are output by the verifying unit 1009 as the verification result 122. For example, the verification result 122 is displayed on a display, output to a printer for printout, and/or transmitted to an external device via the communication I/F 908. The verification result 122 may be stored to a storage area such as the RAM 903, the magnetic disk 905, and the optical disk 907.

The functional units such as the converting unit 1008 and the verifying unit 1009 are not requisite, and may be arranged external to the verification support apparatus 100. If the function of the converting unit 1008 is implemented by an external device, a CFG converted by the external device is input to the verification support apparatus 100. Similarly, the verifying unit 1009 may be implemented by the external device. If the verifying unit 1009 is arranged externally, the assertion data 121 is output as the output data 120 of the verification support apparatus 100.

Figure 11:
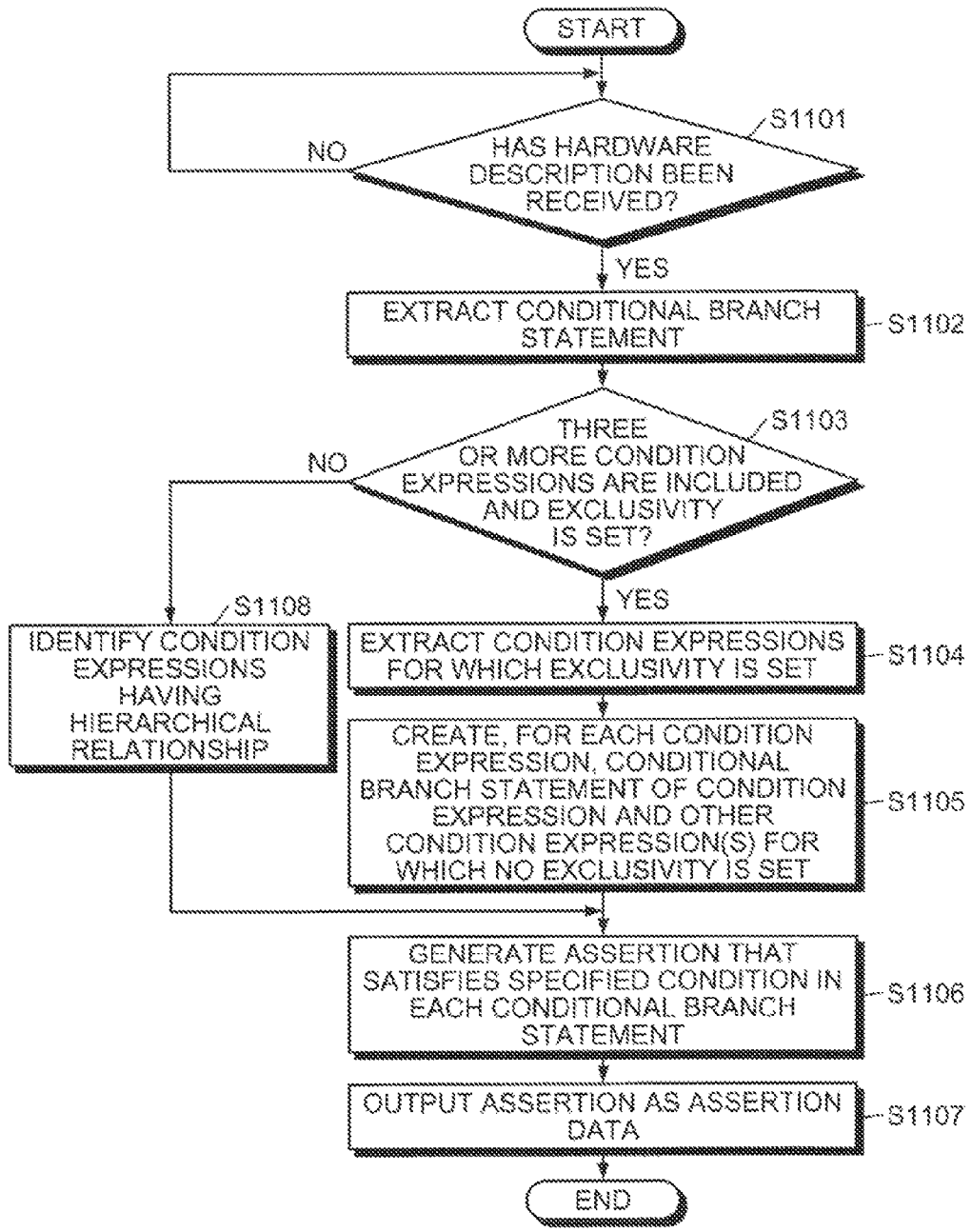
FIG. 11 is a flowchart of a verification support process.

FIG. 11 is a flowchart of a verification support process. The flowchart of FIG. 11 depicts a procedure of extracting a conditional branch statement from the hardware description 101 of the target circuit and generating assertion data for verifying whether the priority of condition expressions in the target circuit is based on the specification. By executing the processes of FIG. 11, assertion data enabling verification without omission can be generated even for a conditional branch statement that includes a combination of exclusive condition expressions and thus conventionally, has a higher possibility of omission in verification.

As depicted in FIG. 11, the verification support apparatus 100 determines whether the hardware description 101 of the target circuit has been received by the statement extracting unit 1001 (step S1101). If not (step S1101: NO), the process stands by until the statement extracting unit 1001 receives the hardware description 101. Upon receiving the hardware description 101 (step S1101: YES), the statement extracting unit 1001 extracts a conditional branch statement from the received hardware description 101 (step S1102).

If the converting unit 1008 is provided in the verification support apparatus 100, the hardware description 101 is received by the converting unit 1008. The converting unit 1008 converts the received hardware description 101 into a CFG, and provides the CFG to the statement extracting unit 1001. Upon receiving the CFG, the statement extracting unit 1001 extracts the conditional branch statement from the CFG.

The determining unit 1002 determines whether the extracted conditional branch statement satisfies a given condition. Specifically, the determining unit 1002 determines whether at least three condition expressions are included in the conditional branch statement and exclusivity has been set (step S1103).

If so (step S1103: YES), the condition expression extracting unit 1003 extracts condition expressions for which the exclusivity is set, from the conditional branch statement extracted at step S1102 (step S1104).

The creating unit 1004 creates, for each condition expression, a conditional branch statement of the condition expression and a condition expression(s) for which no exclusivity is set (step S1105). Specifically, the creating unit 1004 separates the combination of condition expressions extracted at step S1104, and creates a conditional branch statement in which the condition expression has a hierarchical relationship with the remaining condition expression(s).

The generating unit 1005 generates an assertion for verifying whether a specified condition is satisfied for each conditional branch statement generated at step S1105 (step S1106). The output unit 1006 outputs the assertion generated at step S1106 as the assertion data 121 (step S1107), ending a sequence of the processes.

According to the processes described above, assertion data is output for verifying the conditional branch statement that is determined to include three or more condition expressions for which the exclusivity is set. On the other hand, if the determining unit 1002 determines that the conditional branch statement is not such a conditional branch statement (step S1103: NO), the identifying unit 1007 identifies condition expressions having a hierarchical relationship from the conditional branch statement (step S1108). The condition expressions identified at step S1108 are used to generate the assertion at step S1106.

As described above, according to the verification support apparatus 100 of the embodiment, assertion data enabling verification without omission are generated even for a conditional branch statement that includes a combination of exclusive condition expressions and thus has a higher possibility of omission in verification, thereby improving verification accuracy.

Figure 12:
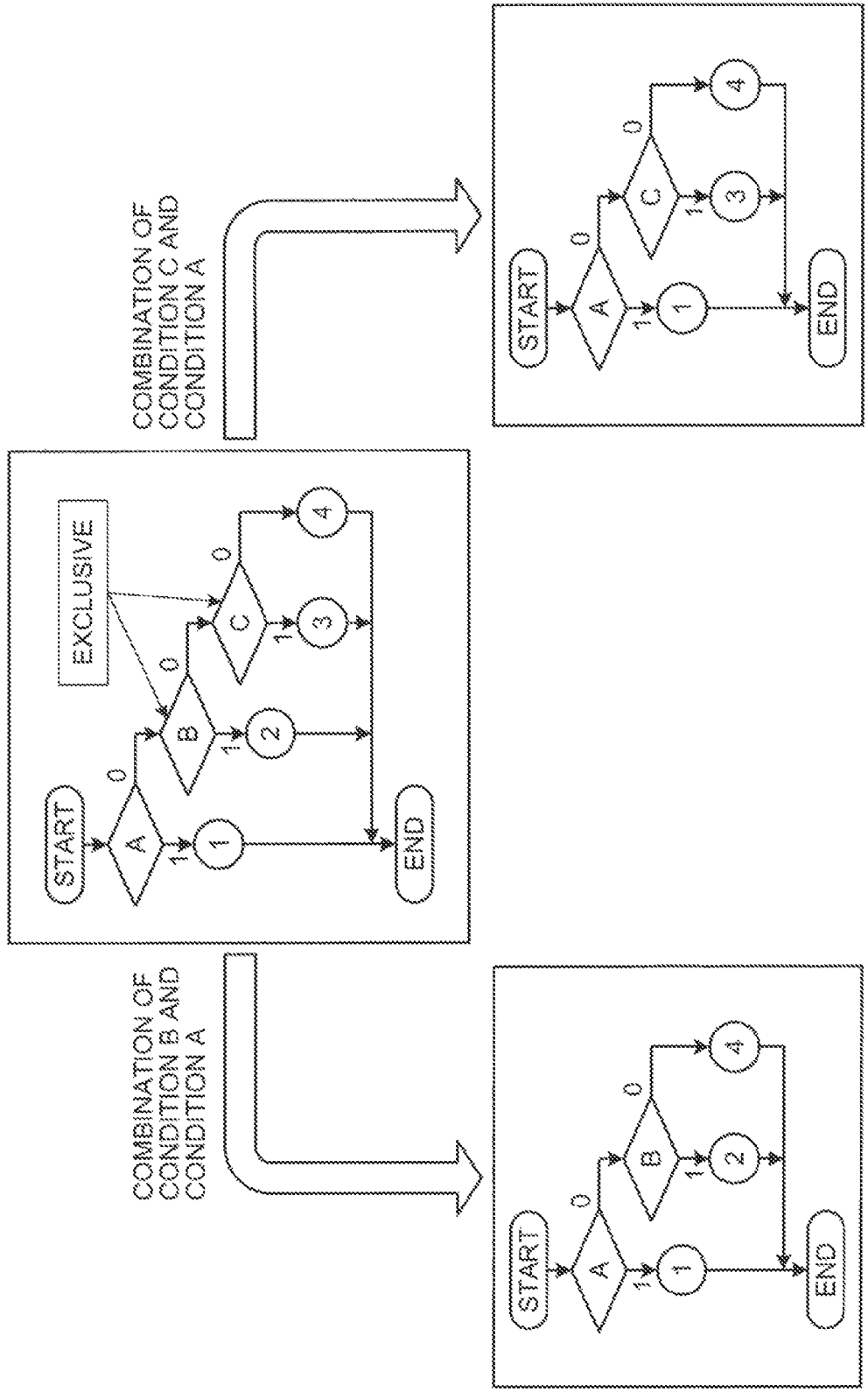
FIG. 12 depicts an exemplary combination of exclusive condition expressions.

FIG. 12 depicts an exemplary combination of exclusive condition expressions. A generation of assertion data for a conditional branch statement in which condition expressions B and C are set to be exclusive as depicted in FIG. 12 is described.

Condition expressions B and C are separated, and conditional branch statements in which condition expressions B and C have a hierarchical relationship with condition expression A for which no exclusivity is set are created, respectively. Specifically, the conditional branch statements are created respectively for: 1) the combination of condition expression B and the condition expression A; and 2) the combination of condition expression C and the expression A.

1) Combination of Condition Expression B and the Condition Expression A

A priority of "A>B" is set by the specification 102. Thus, assertion data i for verifying the priority, i.e., "cover (condition expression A and condition expression B)" is generated. The bug models 2, 3, and 4 are detected by assertion data i.

2) Combination of Condition Expression C and the Other Condition Expression A

A priority of "A>C" is set by the specification 102. Thus, assertion data ii for verifying the priority, i.e., "cover (condition expression A and condition expression C)" is generated. The bug models 3, 4, and 5 are detected by assertion data ii.

FIG. 13 depicts a relationship between the bug models and the assertions when exclusivity is taken into account. As described above, data in rows 610 and 620 of the chart 600 cannot be obtained since the exclusivity is set. Instead, the output of rows 1300 can be obtained by executing simulation verification according to the newly generated assertion data i and ii.

Specifically, an occurrence of the bug model 2, 3, or 4 can be detected since the output value of (A, B, C)=(1, 1, 0) can be obtained by the assertion data i. An occurrence of the bug model 3, 4, or 5 can be detected since the output value of (A, B, C)=(1, 0, 1) can be obtained by the assertion data ii. Thus, verification for bug models 2 to 5 is covered. The remaining bug model 1 (1310) is never output due to the restriction of the exclusivity between condition expressions B and C. Consequently, the verification of substantially all bug models is covered.

Figure 14:
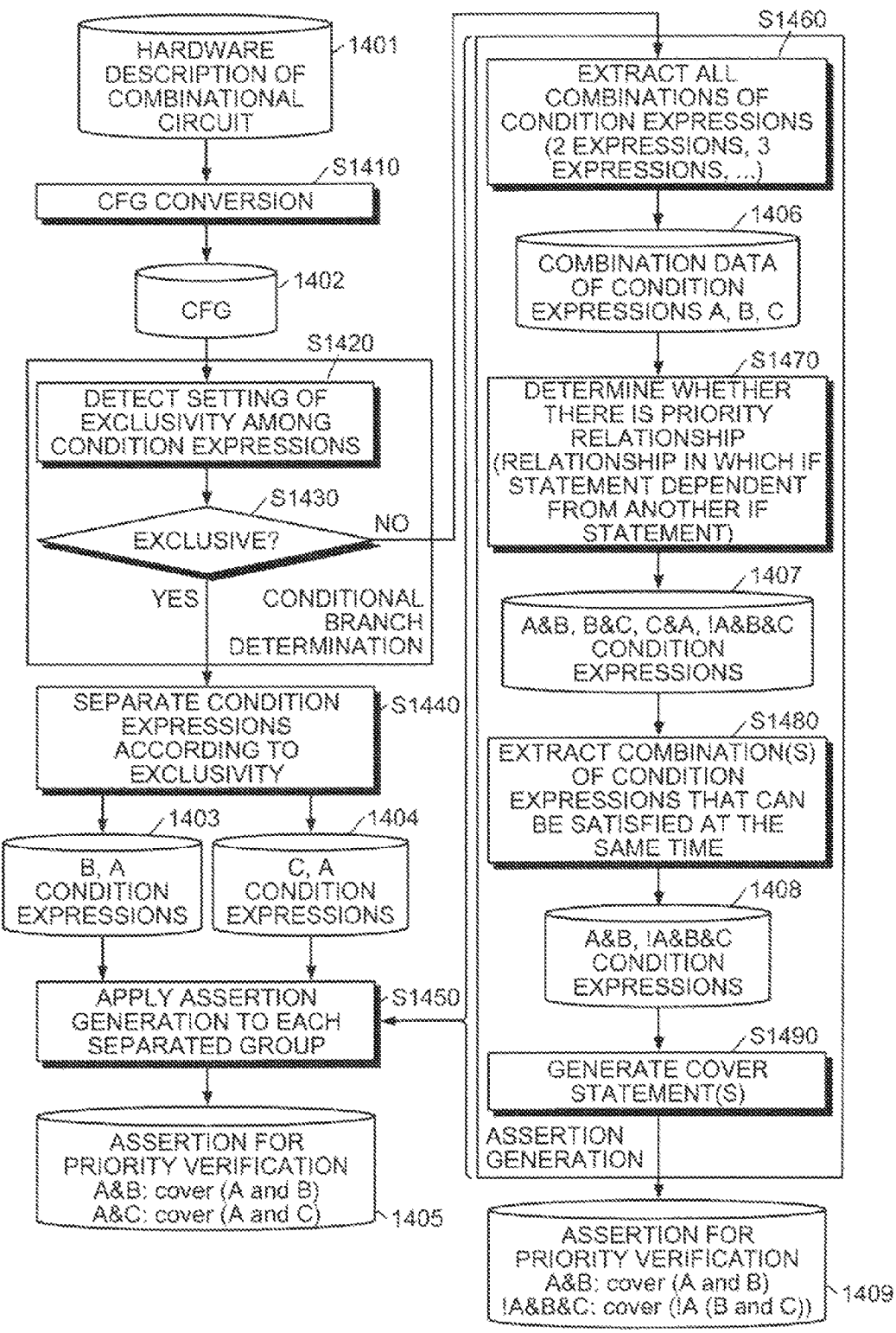
FIG. 14 depicts an exemplary implementation of the verification support apparatus.

FIG. 14 depicts an exemplary implementation of the verification support apparatus. As depicted in FIG. 14, when a hardware description 1401 of a combinational circuit is input as the hardware description 101, the CFG conversion is performed (step S1410), and a CFG 1402 is output.

The verification support apparatus 100 further performs a conditional branch determination using the CFG 1402. The verification support apparatus 100 detects the setting of exclusivity among condition expressions (step S1420). Based on the result of detection, the verification support apparatus 100 determines whether there is exclusivity (step S1430). If so (step S1430: YES), the verification support apparatus 100 separates condition expressions according to exclusivity (step S1440).

If not (step S1430: NO), the verification support apparatus 100 proceeds to assertion generation represented by steps S1460 to S1490. The verification support apparatus 100 extracts all combinations of condition expressions (step S1460), and generates combination data 1406 for the condition expressions.

The verification support apparatus 100 determines whether there is a priority relationship with respect to the combination data 1406 (step S1470), and extracts a combination(s) of condition expressions 1407 (A and B, B and C, C and A, and !A and B and C) determined to have the priority. The verification support apparatus 100 further extracts, from among the extracted combination(s) of condition expressions 1407, a combination(s) of condition expressions that can be satisfied at the same time (step S1480). At step S1480, condition expressions 1408 A and B, and !A and B and C are extracted.

The verification support apparatus 100 generates cover statements for the extracted condition expressions 1408 (step S1490), thereby generating assertions 1409 for priority verification.

Referring back to the process when the condition expressions are determined to be exclusive (step S1430: YES), by the separation at step S1440, condition expressions 1403 that include condition expressions B and A and condition expressions 1404 that include condition expressions C and A are created from the conditional branch statement that includes condition expressions A, B, and C. The verification support apparatus 100 applies the assertion generation to each separated group (1403, 1404) (step S1450), thereby generating assertions 1405 for priority verification.

As described above, in the exemplary implementation, it is determined whether the conditional branch statement that represents a conditional branch process has a configuration that satisfies a given condition (i.e., including three or more condition expressions and set to be exclusive). Thus, assertion data without omission in verification can be generated according to the configuration of the target circuit.

Figure 15:
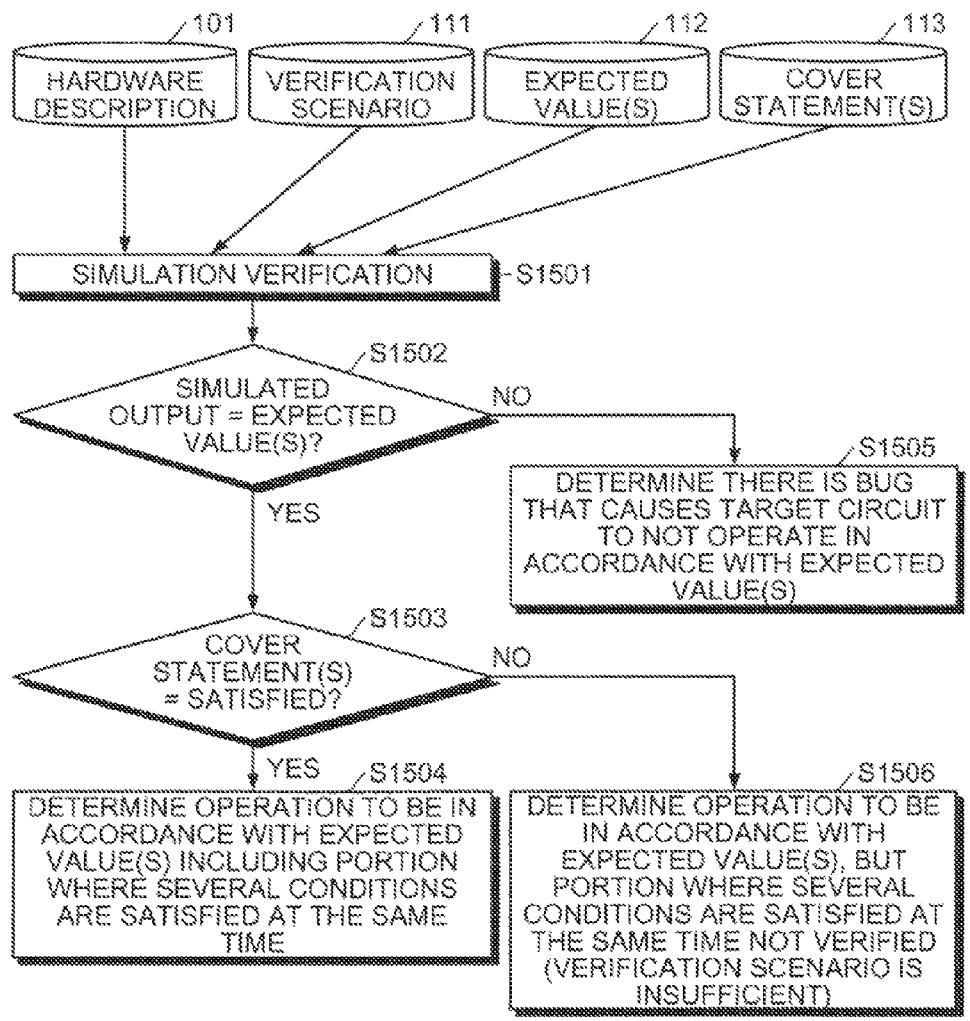
FIG. 15 depicts an example of a simulation verification using a cover statement.

FIG. 15 depicts an example of a simulation verification using a cover statement(s). When the assertion data 121 for verifying the conditional branch statement in the target circuit is generated, the verification support apparatus 100 performs simulation verification using the hardware description 101 of the target circuit, a verification scenario 111, an expected value(s) 112, and a cover statement(s) 113 representing an assertion(s) (step S1501).

After the simulation verification at step S1501, the verification support apparatus 100 determines whether simulated output is equivalent to expected value(s) 112 (step S1502). If so (step S1502: YES), the verification support apparatus 100 proceeds to step S1503. If not (step S1502: NO), the verification support apparatus 100 determines that the hardware description 101 includes a bug that causes the target circuit not to operate in accordance with the expected value(s) 112 (step S1505).

When determining that the simulated output(s) is equal to the expected value(s) 112 (step S1502: YES), the verification support apparatus 100 further determines whether the process of the cover statement 113 is satisfied (step S1503). If so (step S1503: YES) and the verification scenario 111 has been executed, the verification support apparatus 100 determines that operation, including a portion where several conditions are satisfied at the same time, has been executed, yielding the expected values 112 (step S1504).

On the other hand, if cover statement is not satisfied (step S1503: NO), the verification support apparatus 100 determines that operation in accordance with the expected value(s) 112 has been executed by the verification scenario 111 but the portion where several conditions are satisfied at the same time has not yet been verified (step S1506). This means that the verification scenario 111 is insufficient. Thus, a verifier can improve the verification accuracy by preparing a verification scenario 111 for verifying the portion not yet verified.

Figures 16, 17:
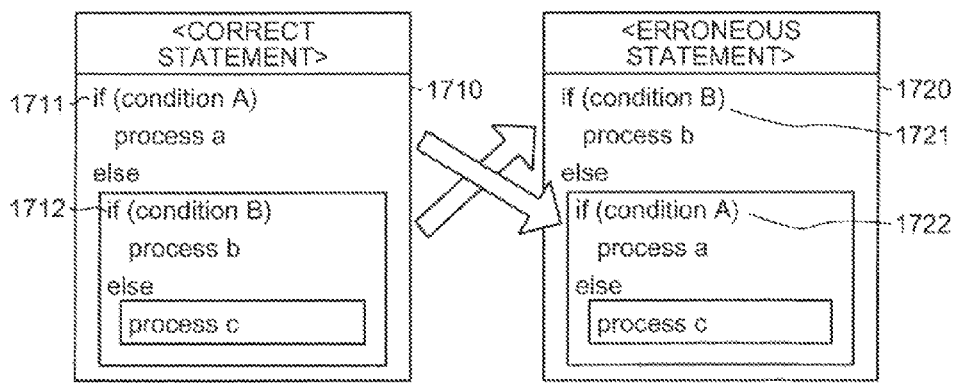
FIG. 16 depicts an exemplary output of a result of the simulation.
FIG. 17 depicts an example in which an error in a conditional branch is missed.

FIG. 16 depicts an exemplary output of a result of the simulation. Determination is made as shown in a chart 1600 according to the output of the result of the simulation verification described in FIG. 15. The verifier refers to the result of the determination, detects an omission in the verification scenario, and adds a missing verification scenario, thereby achieving a verification coverage having the true coverage rate of 100%.

As described above, according to the embodiment, assertion data is generated for a conditional branch statement that is created for each condition expression separated from exclusive condition expressions. Thus, the verification support apparatus 100 can detect all possible bug models without omission, thereby achieving a highly-accurate verification.

The above technology can further generate an assertion for verifying whether the condition expressions included in each conditional branch statement newly created by the verification support apparatus 100 satisfy a specified condition, for example, whether condition expressions are included in each conditional branch statement according to a specified priority. Thus, the verification support apparatus 100 can automatically generate assertion data for executing simulation verification without omission in verification.

The above technology can further generate, when the conditional branch statement does not satisfy the given condition, assertion data by referring to the order of appearance in the hardware description 101 and identifying condition expressions having a hierarchical relationship. Thus, the verification support apparatus 100 can generate optimal assertion data according to the configuration of the target circuit, thereby achieving a highly-accurate verification.

The above technology can convert the hardware description 101 of the target circuit into a CFG that represents the control flow in the circuit, and extract the conditional branch statement from the CFG. Thus, the verification support apparatus 100 can extract the conditional branch statement from the CFG, with less burden and higher speed compared to the hardware description 101.

The above technology can further generate a cover statement for verifying that the extracted condition expressions are satisfied at the same time as an assertion. Thus, the verification support apparatus 100 can generate assertion data automatically.

The above technology can further determine, using the output assertion data, whether the output value(s) obtained by executing the verification scenario is equal to the expected value(s). Thus, the verification support apparatus 100 can verify the operation of the target circuit automatically.

The verification support method described in the present embodiment may be implemented by executing a prepared program on a computer such as a personal computer and a workstation. The program is stored on a non-transitory computer-readable recording medium such as a hard disk, a flexible disk, a CD-ROM, an MO, and a DVD, read out from the recording medium, and executed by the computer. The program may be a transmission medium that can be distributed through a network such as the Internet.

The verification support apparatus 100 described in the present embodiment can be realized by an application specific integrated circuit (ASIC) such as a standard cell or a structured ASIC, or a programmable logic device (PLD) such as a field-programmable gate array (FPGA). Specifically, for example, functional units (statement extracting unit 1001 to verifying unit 1009 of the verification support apparatus 100 are defined in hardware description language (HDL), which is logically synthesized and applied to the ASIC, the PLD, etc., thereby enabling manufacture of the verification support apparatus 100.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A non-transitory computer-readable recording medium storing therein a verification support program that causes a computer to execute a procedure, the procedure comprising:
    extracting from hardware description of a target circuit, a conditional branch statement that represents a conditional branch process;
    determining whether the conditional branch statement extracted at the extracting includes at least three condition expressions, where a given combination thereof has satisfying conditions that are set to be exclusive;
    extracting from the conditional branch statement determined at the determining, a combination of condition expressions for which satisfying conditions are set to be exclusive;
    extracting each condition expression from the combination of condition expressions extracted at the extracting and creating, for each extracted condition expression and according to an order of appearance in the hardware description, a conditional branch statement in which the extracted condition expression has a hierarchical relationship with a condition expression not included in the combination;
    generating an assertion for checking whether a specified condition is satisfied in each conditional branch statement created at the creating; and outputting, as assertion data of the target circuit, the assertion generated at the generating.

2. The non-transitory recording medium according to claim 1, wherein
the specified condition is a priority, and
the assertion generated at the generating is an assertion for verifying whether the condition expressions are included, according to the priority, in each conditional branch statement created at the creating.

3. The non-transitory recording medium according to claim 1, the procedure further comprising:
identifying, when the conditional branch statement is determined at the determining to not include at least three condition expressions, where a given combination thereof has satisfying conditions that are set to be exclusive, condition expressions having a hierarchical relationship by referring to the order of appearance in the hardware description, wherein
the extracting includes extracting, from the condition expressions identified at the identifying, a combination of condition expressions for which the specified condition can be satisfied, and
the generating includes generating an assertion for verifying whether the specified condition is satisfied in the conditional branch statement that includes the combination of condition expressions extracted at the extracting.

4. The non-transitory recording medium according to claim 1, the procedure further comprising:
converting the hardware description into a control flow graph that represents a control flow in the target circuit, wherein
the extracting includes extracting, from the control flow graph converted at the converting, the conditional branch statement that represents the conditional branch process.

5. The non-transitory recording medium according to claim 1, wherein the generating includes generating, as the assertion, a cover statement that causes the condition expressions extracted at the extracting to be satisfied at the same time.

6. The non-transitory recording medium according to claim 1, the procedure further comprising:
verifying the target circuit based on whether an output value is equivalent to an expected value, the output value being obtained by using the assertion output at the outputting to execute a verification scenario associated with each combination of condition expressions.

7. A verification support apparatus comprising:
a memory to store executable instructions; and
a processor executing the instructions, which when executed cause the processor
to extract from hardware description of a target circuit, a conditional branch statement that represents a conditional branch process;
to determine whether the conditional branch statement extracted includes at least three condition expressions, where a given combination thereof has satisfying conditions that are set to be exclusive;
to extract from the conditional branch statement determined, a combination of condition expressions for which satisfying conditions are set to be exclusive and from the extracted combination, to extract each condition expression;
to create for each extracted condition expression and according to an order of appearance in the hardware description, conditional branch statement in which the extracted condition expression has a hierarchical relationship with a condition expression not included in the combination;
to generate an assertion for checking whether a specified condition is satisfied in each conditional branch statement created; and
to output, as assertion data of the target circuit, the assertion generated.

8. A verification support apparatus comprising:
a processor configured to execute a procedure, the procedure comprising:
extracting from hardware description of a target circuit, a conditional branch statement that represents a conditional branch process;
determining whether the conditional branch statement extracted at the extracting includes at least three condition expressions, where a given combination thereof has satisfying conditions that are set to be exclusive;
extracting from the conditional branch statement determined at the determining, a combination of condition expressions for which satisfying conditions are set to be exclusive;
extracting each condition expression from the combination of condition expressions extracted at the extracting and creating, for each extracted condition expression and according to an order of appearance in the hardware description, a conditional branch statement in which the extracted condition expression has a hierarchical relationship with a condition expression not included in the combination;
generating an assertion for checking whether a specified condition is satisfied in each conditional branch statement created at the creating; and
outputting, as assertion data of the target circuit, the assertion generated at the generating.

9. A verification support method comprising:
extracting from hardware description of a target circuit, a conditional branch statement that represents a conditional branch process;
determining whether the conditional branch statement extracted at the extracting includes at least three condition expressions, where a given combination thereof has satisfying conditions that are set to be exclusive;
extracting from the conditional branch statement determined at the determining, a combination of condition expressions for which satisfying conditions are set to be exclusive;
extracting each condition expression from the combination of condition expressions extracted at the extracting and creating, for each extracted condition expression and according to an order of appearance in the hardware description, a conditional branch statement in which the extracted condition expression has a hierarchical relationship with a condition expression not included in the combination;
generating an assertion for checking whether a specified condition is satisfied in each conditional branch statement created at the creating; and
outputting, as assertion data of the target circuit, the assertion generated at the generating.

* * * * *